United States Patent [19]

Mok et al.

[11] Patent Number: 5,621,242
[45] Date of Patent: Apr. 15, 1997

[54] SEMICONDUCTOR PACKAGE HAVING SUPPORT FILM FORMED ON INNER LEADS

[75] Inventors: Seung-Kon Mok, Seoul; Seung-Ho Ahn; Gu-Sung Kim, both of Suwon, all of Rep. of Korea

[73] Assignee: Samsung Electronics Co., Ltd., Suwon, Rep. of Korea

[21] Appl. No.: 658,404

[22] Filed: Jun. 5, 1996

Related U.S. Application Data

[63] Continuation of Ser. No. 438,728, May 10, 1995, abandoned.

[30] Foreign Application Priority Data

May 16, 1994 [KR] Rep. of Korea .................. 1994-10598

[51] Int. Cl.⁶ .................. H01L 23/50; H01L 23/28; H01L 23/48; H01L 23/02
[52] U.S. Cl. .................. 257/666; 257/673; 257/669; 257/676; 257/688; 257/735
[58] Field of Search .................. 257/666, 669, 257/673, 675, 692, 699, 706, 708, 729, 735, 789, 795, 796, 667, 671, 688, 672, 676

[56] References Cited

U.S. PATENT DOCUMENTS

| | | | |
|---|---|---|---|
| 5,018,005 | 5/1991 | Lin et al. .................. | 257/730 |
| 5,173,766 | 12/1992 | Long et al. .................. | 257/668 |
| 5,300,808 | 4/1994 | Suppelsa et al. .................. | 257/680 |
| 5,334,858 | 8/1994 | Wada .................. | 257/666 |
| 5,359,222 | 10/1994 | Okutomo et al. .................. | 257/666 |
| 5,375,041 | 12/1994 | McMahon .................. | 257/688 |
| 5,388,029 | 2/1995 | Moriyama .................. | 257/692 |
| 5,477,080 | 12/1995 | Ishisaka et al. .................. | 257/673 |
| 5,536,969 | 7/1996 | Matsuoka .................. | 257/676 |

FOREIGN PATENT DOCUMENTS

| | | | |
|---|---|---|---|
| 0030184 | 3/1977 | Japan .................. | 257/666 |
| 62-232944 | 10/1987 | Japan .................. | 257/729 |
| 0062362 | 3/1988 | Japan .................. | 257/667 |
| 4-164361 | 6/1992 | Japan .................. | 257/675 |
| 4-369250 | 12/1992 | Japan .................. | 257/667 |
| 5-243413 | 9/1993 | Japan .................. | 257/667 |
| 93/06621 | 4/1993 | WIPO .................. | 257/675 |

OTHER PUBLICATIONS

Dr. Subash Khadpe, "An Overview of Thin Packages", Semiconductor Pakcaging Update, 1992 no month.

*Primary Examiner*—Sara W. Crane
*Assistant Examiner*—Alexander Oscar Williams

[57] ABSTRACT

A thin semiconductor package having a support film formed on an upper surface of the inner leads with a thickness approximately equal to the thickness of a portion of the molding compound overlaying the inner leads.

21 Claims, 3 Drawing Sheets

SEMICONDUCTOR PACKAGE HAVING SUPPORT FILM FORMED ON INNER LEADS

This is a continuation of application Ser. No. 08/438,728, filed on May 10, 1995, which was abandoned upon the filing hereof.

BACKGROUND OF THE INVENTION

1. Technical Field

This invention relates to semiconductor packages having a very thin vertical body thickness. More particularly, the present invention relates to a thin semiconductor package in which each inner lead is mechanically interconnected by an annular strip of resin attached to the plurality inner leads. This arrangement provides firm support to the inner leads of a Tape Automated Bonding (TAB) tape carrier and to a semiconductor chip joined to it. This arrangement also prevents tilting or shifting of the semiconductor chip during transfer molding processes.

2. Description of the Prior Art

Presently, as electronic devices, such as VCRs, cameras, liquid crystal displays, and memory cards, follow industry trends to smaller size and higher density, new technologies are required to produce semiconductor packages which are lighter, thinner, shorter, and smaller. Such technologies have already, or will soon, produce semiconductor packages having a thickness of only 0.5 mm.

Thin package technologies can be split into two groups: one group using wire bonding to a lead frame, and the other group using Tape Automated Bonding (TAB). In TAB technology, the semiconductor chip is encapsulated by a coating process, or by potting in a molding resin compound. Mass production of TAB devices generally requires screen printing or transfer molding. Transfer molding is an automated version of compression molding in which a plastic molding compound is forced from a pot into a hot mold cavity. Transfer molding of a thin semiconductor package requires particular care in the selection of the molding compound, or in the determination of molding compound characteristics, since the stress placed on the molding compound by ever thinner devices is extreme. Typically, the requirements of a molding compound suitable for use in the thin semiconductor packages are a low viscosity, a high flexural strength, a low thermal shrinkage, and an optimum flow of the mold resin, and the like. These conditions are more strict in the case of transfer molded TAB package.

FIGS. 1 through 4 are cross-sectional views of conventional, thin semiconductor packages 7, 8, 9 and 10. All of these packages utilize TAB technology in which a thin copper film is processed through photolithography to form a plurality of inner leads 14 and outer leads 16. A semiconductor chip 11 is bonded to the inner leads 14 via solder bumps 13. Electrical signals from an external device are delivered to chip 11 or vice verse, through a plurality of electrode pads 12 formed on chip 11.

In the conventional semiconductor packages shown in FIGS. 1 through 4, a support film 15 having a shape or structure as shown in the corresponding Figures is attached to inner leads 14, prior to the (ILB) process in which inner leads 14 are bonded to the electrode pads 12 using thermocompression. Support film 15 functions as a tape or connecting strip for inner leads 14 during the ILB process. Encapsulation of chip 11 and leads 14 is made with a molding resin compound 17.

The conventional semiconductor package 9 in FIG. 3 is somewhat different from the other conventional packages. Package 9 is an ultra thin package in which the upper and side surfaces of semiconductor chip 11 are encapsulated in the molding resin, but the bottom surface of chip 11 remains exposed outside the molding resin.

Transfer molding generally starts after the support film 15 has been attached to inner leads 14. As shown in FIGS. 1–4, within TAB formed devices, semiconductor chip 11 is supported by inner leads 14 and through solder bumps 13 and electrode pads 12. Although support of the semiconductor chip 11 is assisted by support film 15 connected to inner leads 14, it is often not sturdy enough to withstand the enormous pressure created with the hot, liquid molding compound is transferred into the cavities of the mold.

Furthermore, when the molding compound is filled from the bottom of the cavity, the semiconductor chip 11 may be tilted to one side, if it is not exactly centered in the mold relative to the stress or pressure of the injected molding compound. The tilt or shift of the chip 11, in the worst-case scenario, creates an outward protrusion of the chip 11 from the molding compound, and thus causes the following problems.

First, in the subsequently performed reliability test, such as the Pressure Cooker Test or the Temperature Cycle Test, corrosion may occur, or deformation of the metal wiring in the protruding semiconductor chip may occur due to exposure to high pressure and temperature. These problems result in a critical failure of the chip.

Second, exposure of the leads of the TAB device may cause current leakage or a short circuit.

Third, the thickness of the molding resin on one side becomes larger than that on the other side of the semiconductor chip when the chip tilts. This difference in the thickness of the molding resin may be one of the major causes of the package cracks.

SUMMARY OF THE INVENTION

Accordingly, it is an object of the present invention to prevent the tilting or protrusion of the semiconductor chip which may occur during the transfer molding process.

Another object of this invention is to provide a highly reliable thin package formed using TAB which can be encapsulated using low cost transfer molding technology.

Briefly, according to the present invention, the thin semiconductor package comprises a tape carrier having a plurality of inner leads and outer leads electrically connected to the electrode pads of a semiconductor chip via solder bumps, a dam bar formed between the inner leads and the outer leads, a device hole for receiving the semiconductor chip, a gate hole, and an air venting hole, wherein the inner leads are mechanically interconnected together and supported by a support film, which support film having a height substantially equal to the distance from the inner lead to the top surface of the mold resin formed by a transfer molding process.

These features and other advantages will be more clearly understood from the following detailed description taken in conjunction with the accompanying drawings.

DETAILED DESCRIPTION OF PREFERRED EMBODIMENTS

Figure 1:
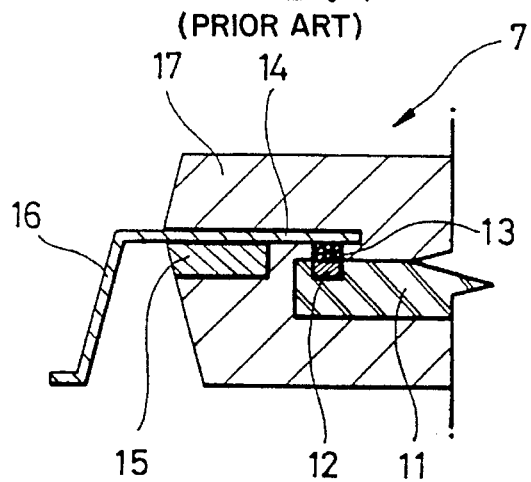
FIGS. 1 through 4 illustrate, in cross section, conventional semiconductor packages in which the inner leads of TAB is connected by a support film.
Figure 2:
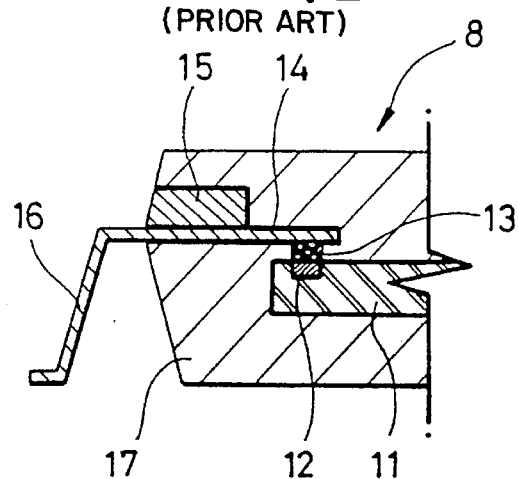
Figure 3:
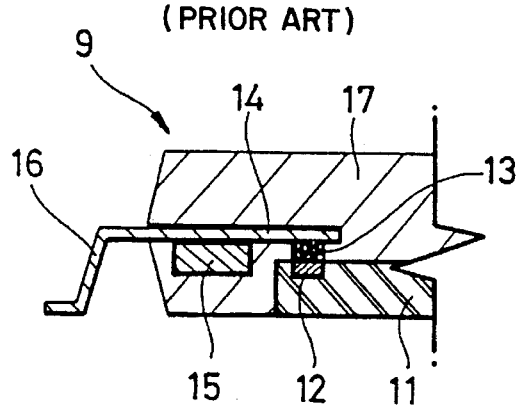
Figure 4:
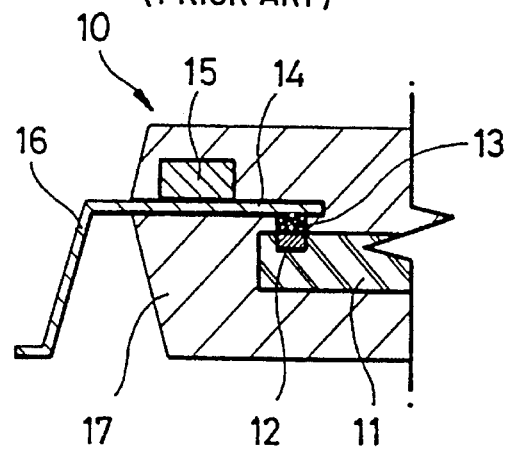
Figure 5:
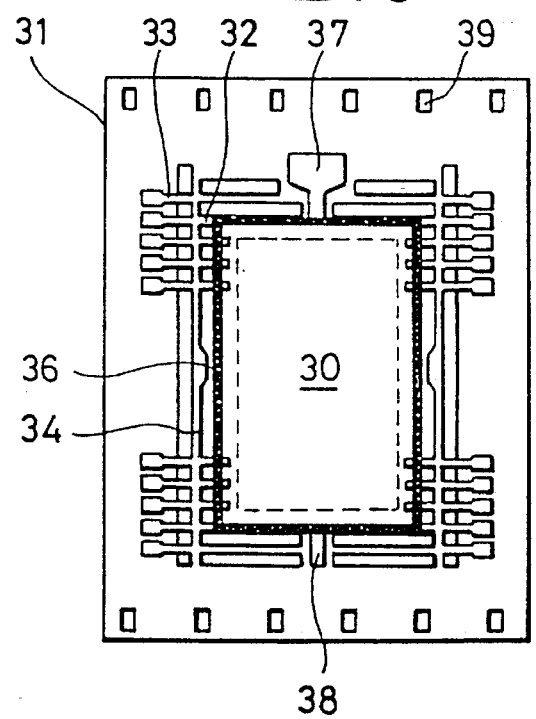
FIGS. 5 and 6 are a plan view and a bottom plan view, respectively, of the tape carrier suitable for use in the thin semiconductor package according to this invention.
Figure 6:
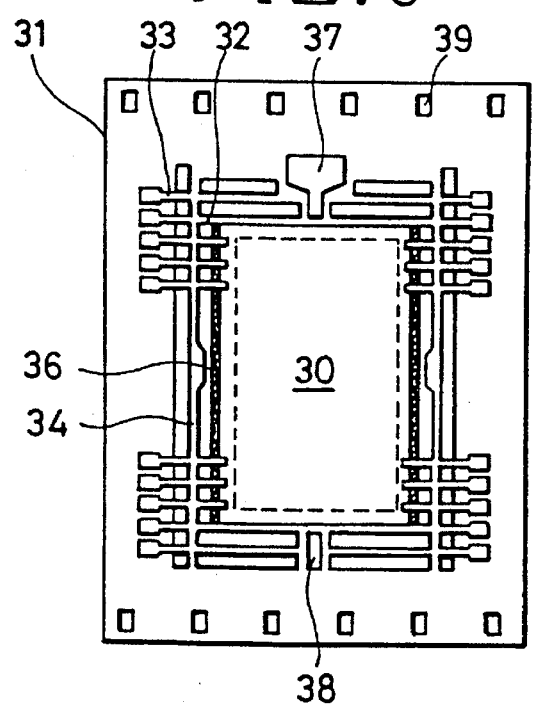

FIG. 5 and FIG. 6 show a tape carrier which is properly applicable to the thin semiconductor package according to the present invention. The tape carrier (also referred to as a film carrier) is provided with a base film 31 pre-punched at top and bottom sides with several sprocket holes 39 for transferring the tape carrier.

Base film 31 is laminated with a metal, for example with a copper foil, and the metal layer is photo-etched so as to form a predefined pattern of inner leads 32, outer leads 33 and a dam bar 34. A larger hole 30 in the tape carrier, which is shown by the dotted line in FIG. 5, is a device hole for receiving, prior to the bonding of the inner leads, a semiconductor chip. At the top of the device hole 30, there is formed a gate hole 37 through which a mold resin will be injected in the transfer molding process, while an air vent hole 38 formed opposite to the gate hole 37 allows for the air contained in the mold cavity to escape. The dam bar 34 between the inner leads 32 and the outer leads 33 serves to prevent the bleeding out of the molding resin from the mold cavity during the transfer molding process.

At the edges of inner leads 32, the semiconductor chip is electrically connected via solder bumps. The support film 36 according to this invention is attached to the inner leads at the position between dam bar 34 and the solder bump connection point. With support film 36 connecting all of the inner leads 32 as shown in FIG. 5, the support film 36 supports not only the inner leads during the ILB process, but also the semiconductor chip, as will be explained here-in-after, during the transfer molding process.

FIG. 6 shows a tape carrier, viewed from the bottom, having support film 36 attached to the corresponding position, but the support film 36 is blocked at the top and bottom of the device hole 30, and not visible because of the patterned metal conductive lines.

Figure 7:
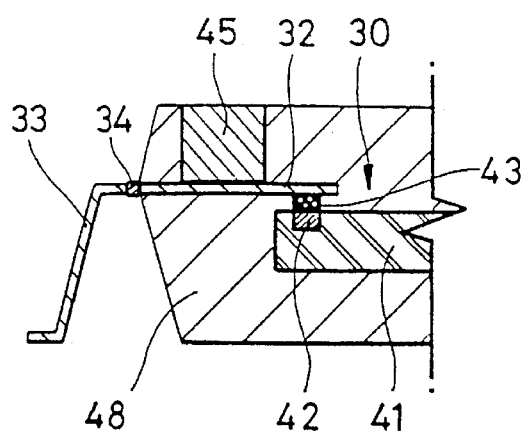
FIGS. 7 through 10 illustrate, in cross section, the preferred embodiments of a thin semiconductor package according to this invention, in which the support film attached to the inner leads has a height reaching to the upper surface of the cavity.

FIG. 7 shows a thin semiconductor package according to this invention after completion of the transfer molding process of the semiconductor chip bonded to the tape carrier having a structure explained with reference to FIG. 5. In this figure, the same reference numerals will be used for corresponding elements as were used in FIG. 6.

The semiconductor chip 41 is electrically connected to the inner leads 32 via electrode pads 42 and solder bumps 43. The solder bumps 43 may be formed of gold or copper, and were formed on the electrode pads 42 of the chip 41 during wafer processing through which chip 41 of a predetermined circuitry was fabricated, e.g., by a bumped chip TAB process. Alternatively, solder bumps 43 may be formed on the inner leads 43, e.g., by a bumped lead process. Because the semiconductor chip 41 itself is required to be thinner in the thin package, a so-called wafer back lap process in which the back of the wafer is ground and polished should be followed by EDS test and the wafer process.

Now, the process of fabricating the thin semiconductor package constructed as shown in FIG. 7 will be described.

The base film is punched to have device hole 30. A metal foil is laminated on the base film and then patterned so as to form a lead pattern including inner leads 32, outer leads 33 and dam bar 34. On the inner leads 32, support film 36 having a predetermined thickness is attached. The support film 36 must be placed such that it can provide enough mechanical support for the inner leads 32 during ILB and during transfer molding process. However, it must not be too close to the ILB bonding region. The thickness of support film 36 is preferably equal to the distance from the upper surface of the inner leads 32 to the top surface of the semiconductor package or within approximately 30 μm of that distance. The support film 36 should be made of heat-resistant and adhesive material, and preferably of polyimide or polyphenylene sulfide.

The inner lead bonding is begun after support film 36 has been completed and adhered. In ILB, the semiconductor chip 41 is aligned and positioned to fit device hole 30 of the carrier, and solder bumps 43 and inner leads 32 are bonded by applying high temperature and pressure. The chip-tape carrier assembly is then loaded into the mold die of the transfer molding machine. After accurate alignment within the cavity 48 is done, hot, liquid molding compound is transferred into the mold cavities through the gate hole 37 under high pressure and temperature. The mold pressure is mainly determined by the number of the cavities. For example, if there are 150 to 160 cavities, the mold resin would be injected under approximately 165 tons at 175° C. The viscosity of mold resin varies depending upon the composition of the mold resin. In TAB thin package, the viscosity is preferably within a range of 200–250 poise with respect to 400 poise generally used in conventional package device. At this time, an air contained in each of the cavities flows out through the air venting hole 38, and cavity 48 is filled with the resin from the bottom.

It should be noted that it is possible to very strongly fix and support the semiconductor chip 41 and the leads 32, 33 within the present invention, as support film 36 contacts the top surface of the cavity 48. As a result, inner leads 32 and the semiconductor chip 41 can endure the mold pressure, and will not easily be damaged during the transfer molding process.

The post-molding processes such as a dam bar cutting, and trimming of the outer leads 46 may be conducted by the conventional processes and not be described in detail here.

Figure 8:
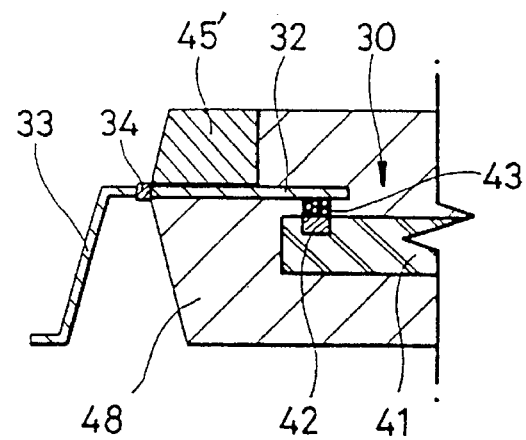

FIG. 8 illustrates another embodiment of this invention in which the same reference numerals are used for the same elements as those of FIG. 7.

The difference between the embodiments shown in FIGS. 7 and 8 is in shape of the support films (45 and 45'). The support film 45 of FIG. 7 is rectangular in shape, whereas the support film 45' is trapezoidal in shape. Accordingly, support film 45' may contact the top surface as well as the side surface of the cavity, thereby reinforcing the mechanical strength of support for the leads 32 and the chip 41. The trapezoid support film 45' renders a further decrease in the amount of the molding resin bleeding out of the cavity.

Figure 9:
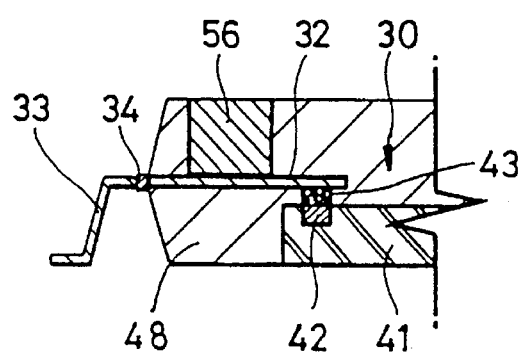
Figure 10:
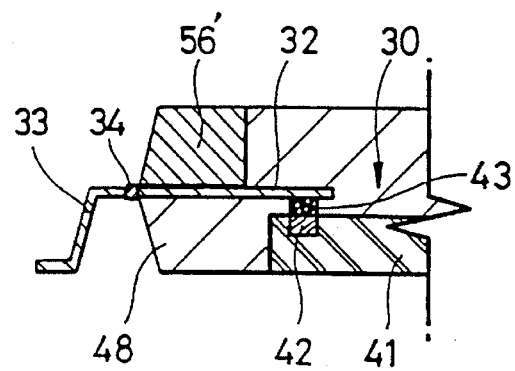

FIG. 9 and 10 show other embodiments of the present invention, wherein the support film (56 and 56') are applied to an ultra thin semiconductor package, e.g., UTSOP (Ultra Thin Small Outline Package in which the upper and side surface of the chip are encapsulated with resin, but the bottom surface of the chip is exposed, and the thickness of the package body are half of that of the typical thin package). In these Figures, the same numerals are used to the same features shown in FIGS. 7 and 8. The working effect of support film 56 and 56' is to support and fix the semiconductor chip and the inner leads during the transfer molding process as explained with reference to FIGS. 7 and 8. The attachment of the support film to the tape carrier, inner lead bonding process and the transfer molding process are identical to the processes as illustrated above with reference to FIG. 7 and 8, and the detailed description is not provided here.

As explained in detail here-in-before, for the thin package according to the present invention, the semiconductor chip and the inner leads are strongly supported and held by means of an improved support film. Accordingly, any tilt, misalignment, shift or protrusion of the chip or the leads can be prevented, resulting in reduced error and highly reliable packages. Further, while using TAB technology which makes possible packaging of high I/O pin count and high density devices, the transfer molding process can be applicable to the thin package, resulting in low cost in the package production. This invention may be practiced or embodied in still other ways without departing from the spirit or essential character thereof. The preferred embodiments described herein are therefore illustrative and not restrictive, the scope of the invention being indicated by the appended claims and all variations which come within the meaning of the claims are intended to be embraced therein.

What we claim is:

1. A semiconductor package comprising:

a semiconductor chip having a plurality of electrode pads;

a tape carrier comprising, a plurality of inner leads, wherein at least one of the plurality of inner leads is directly bonded to one of the plurality of electrode pads, a support film of first thickness formed on an upper surface of the inner leads, and having an upper surface, outer lateral surface, and an inner lateral surface proximate the semiconductor chip, and, a plurality of outer leads electrically and respectively connected to the inner leads; and, molding compound encapsulating, the plurality of inner leads, at least top and side surfaces of the semiconductor chip, and at least the inner lateral surface of the support film, and being formed to a thickness substantially equal to the first thickness.

2. The thin semiconductor package of claim 1, wherein, the support film is formed of polyimide.

3. The thin semiconductor package of claim 1, wherein, the support film is formed of polyphenylene sulfide.

4. The thin semiconductor package of claim 1, wherein, the support film is formed with a rectangular cross-section extending from the upper surface of the plurality of inner leads to an upper surface of the molding compound.

5. The thin semiconductor package of claim 1, wherein, the support film is formed with a trapezoidal cross-section extending from the upper surface of the plurality of inner leads, to an upper surface of the molding compound, and to an outer edge surface of the molding compound.

6. A thin semiconductor package formed by tape-automated-bonding (TAB) techniques, comprising:

a semiconductor chip having a plurality of electrode pads;

a tape carrier comprising, a plurality of inner leads, wherein at least one of the plurality of inner leads is directly bonded to one of the plurality of electrode pads, a support film formed on an upper surface of the inner leads, and having an upper surface, outer lateral surface, and an inner lateral surface proximate the semiconductor chip, a plurality of outer leads electrically and respectively connected to the inner leads; and, molding compound formed with a planar upper surface, encapsulating at least top and side surfaces of the semiconductor chip, and at least the inner lateral surface of the support film, the molding compound having a first thickness above the upper surface of the plurality of inner leads;

wherein the support film is formed with a thickness less than 30 μm less than the first thickness.

7. The thin semiconductor package of claim 6, wherein, the support film is formed of polyimide.

8. The thin semiconductor package of claim 6, wherein, the support film is formed of polyphenylene sulfide.

9. The thin semiconductor package of claim 6, wherein, the support film is formed with a rectangular cross-section extending from the upper surface of the plurality of inner leads to an upper surface of the molding compound.

10. The thin semiconductor package of claim 6, wherein, the support film is formed with a trapezoidal cross-section extending from the upper surface of the plurality of inner leads, to an upper surface of the molding compound, and to an outer edge surface of the molding compound.

11. A semiconductor package comprising:

a semiconductor chip having a plurality of electrode pads;

a tape carrier comprising, a plurality of leads, wherein at least one of the plurality of leads is directly bonded to one of the plurality of electrode pads, and a support film formed on an upper surface of the plurality of the leads, and having an upper surface, outer lateral surface, and an inner lateral surface proximate the semiconductor chip; and, molding compound formed with an upper surface coplanar with the upper surface of the support film, and encapsulating at least top and side surfaces of the semiconductor chip, and at least the inner lateral surface of the support film.

12. The thin semiconductor package of claim 11, wherein, the support film is formed of polyimide.

13. The thin semiconductor package of claim 11, wherein, the support film is formed of polyphenylene sulfide.

14. The thin semiconductor package of claim 11, wherein, the support film is formed with a rectangular cross-section extending from the upper surface of the plurality of inner leads to an upper surface of the molding compound.

15. The thin semiconductor package of claim 11, wherein, the support film is formed with a trapezoidal cross-section extending from the upper surface of the plurality of inner leads, to an upper surface of the molding compound, and to an outer edge surface of the molding compound.

16. A semiconductor package formed by tape-automated-bonding (TAB) techniques, comprising:

a semiconductor chip having a plurality of electrode pads;

a tape carrier having a device hole adapted to receive the semiconductor chip and a plurality of inner leads, at least one of the inner leads being connected to one of the plurality of electrode pads;

a support film formed over an upper surface of the plurality of inner leads;

a plurality of outer leads electrically and respectively connected to the inner leads; and, molding compound encapsulating the semiconductor chip and the plurality of inner leads, the molding compound having an upper surface coplanar with an upper surface of the support film.

17. The semiconductor package of claim 16, wherein the support film is formed extending from an upper surface of the plurality of inner leads to an upper surface of the molding compound.

18. The semiconductor package of claim 17, wherein the support film is exposed through the upper surface of the molding compound.

19. The semiconductor package of claim 16, wherein each electrode pad in the plurality of electrode pads comprises a solder bump, and wherein respective inner leads from the plurality of inner leads are joined to a corresponding electrode pad via the solder bump.

20. The semiconductor package of claim 16, wherein the support film comprises an inner lateral surface and an outer later surface, wherein the inner lateral surface is encapsulated by the molding compound.

21. The semiconductor package of claim 16, wherein the support film comprises an inner lateral surface and an outer later surface, wherein the inner and outer lateral surfaces are encapsulated by the molding compound.

* * * * *